United States Patent [19]
Bazes

[11] Patent Number: 5,744,983
[45] Date of Patent: Apr. 28, 1998

[54] PHASE DETECTOR WITH EDGE-SENSITIVE ENABLE AND DISABLE

[75] Inventor: Mel Bazes, Haifa, Israel

[73] Assignee: Intel Corporation, Santa Clara, Calif.

[21] Appl. No.: 702,287

[22] Filed: Aug. 23, 1996

Related U.S. Application Data

[63] Continuation-in-part of Ser. No. 433,810, May 3, 1995, Pat. No. 5,583,458.

[51] Int. Cl.$^6$ .................................................. H03D 13/00
[52] U.S. Cl. .............................. 327/3; 327/12; 327/7
[58] Field of Search ................................ 327/2, 3, 5, 7, 327/8, 9, 12

[56] References Cited

U.S. PATENT DOCUMENTS

| | | | |
|---|---|---|---|
| 4,128,812 | 12/1978 | Pavlis | 327/12 |
| 4,222,013 | 9/1980 | Bowers et al. | 331/1 A |
| 4,496,861 | 1/1985 | Bazes | 307/602 |
| 4,546,486 | 10/1985 | Evans | 375/119 |
| 4,620,118 | 10/1986 | Barber | 327/12 |
| 4,904,948 | 2/1990 | Asami | 327/12 |
| 5,036,230 | 7/1991 | Bazes | 307/427 |
| 5,136,253 | 8/1992 | Ueno | 328/133 |
| 5,138,188 | 8/1992 | Bazes | 397/265 |
| 5,289,518 | 2/1994 | Nakao | 377/81 |
| 5,317,202 | 5/1994 | Waizman | 307/269 |
| 5,386,437 | 1/1995 | Yasuda | 375/120 |
| 5,408,200 | 4/1995 | Buhler | 331/1 A |

*Primary Examiner*—Timothy P. Callahan
*Assistant Examiner*—Eunja Shin
*Attorney, Agent, or Firm*—Blakely, Sokoloff, Taylor & Zafman

[57] ABSTRACT

An integrated circuit utilizing a symmetric phase detection circuit for detecting a phase relationship between a reference clock signal and a delayed clock signal. The integrated circuit described herein features a control block circuit coupled to receive the reference clock signal and an enable check signal. The control block circuit generates an enable signal which provides the present invention with the ability to detect the phase difference between signals having the same frequency or signals that differ in frequency by a rational factor. The control block circuit generates the enable signal in response to the enable check signal and the reference clock signal. The enable signal, the reference clock signal, and the delayed clock signal are coupled to the phase detection circuit. In response to the enable signal, the phase detection circuit then determines the phase relationship between the reference clock signal and delayed clock signal.

12 Claims, 9 Drawing Sheets

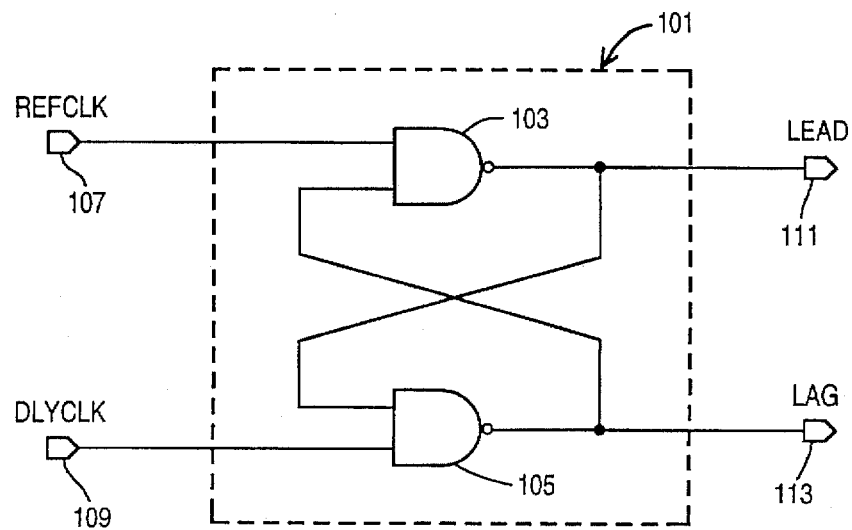
FIG_1 (PRIOR ART)
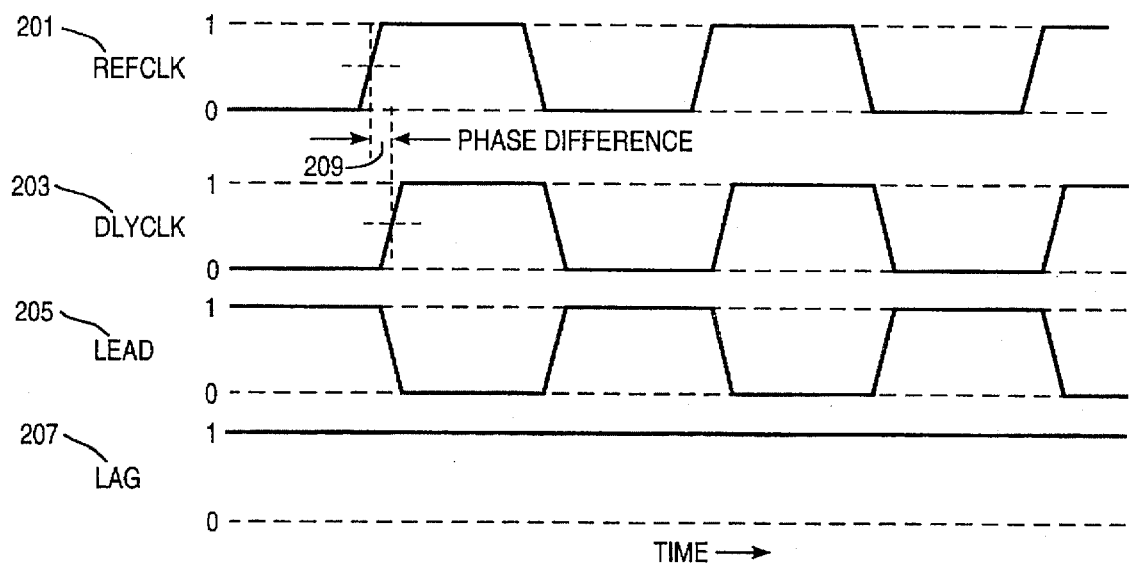
FIG_2 (PRIOR ART)

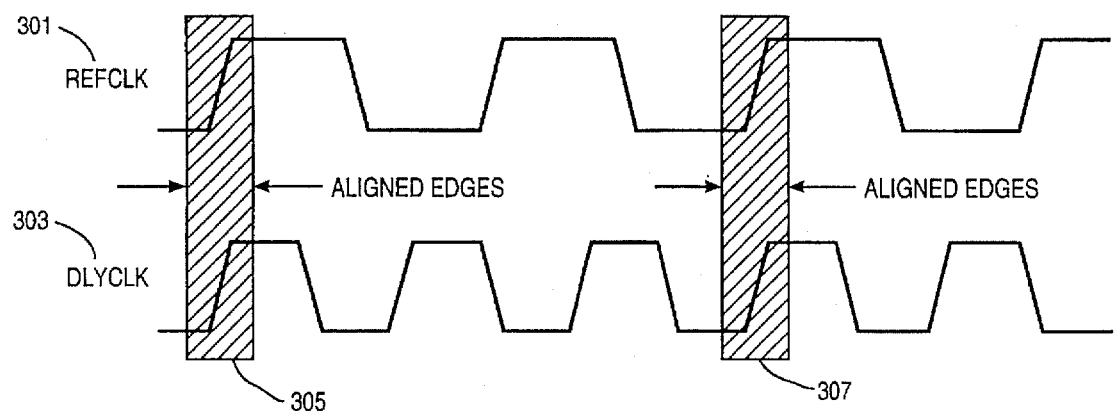
FIG_3 (PRIOR ART)
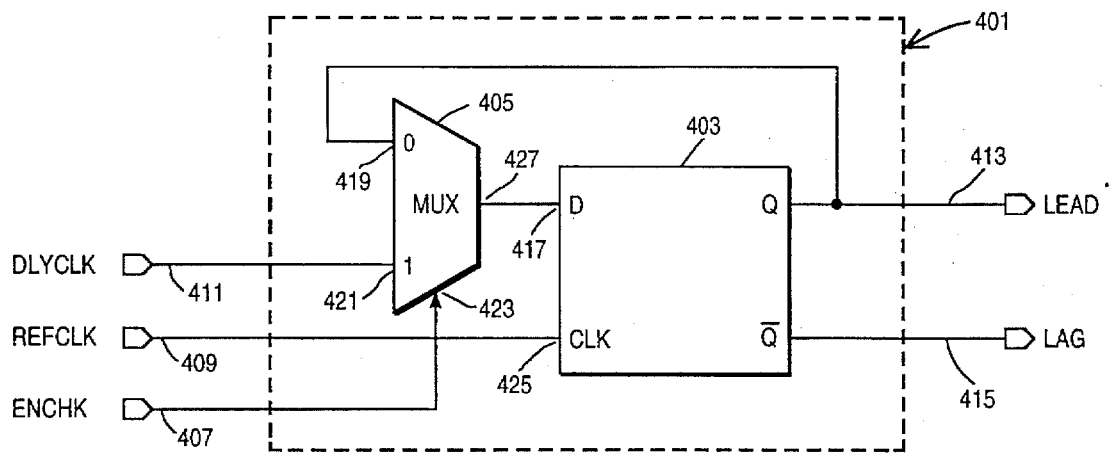
FIG_4 (PRIOR ART)
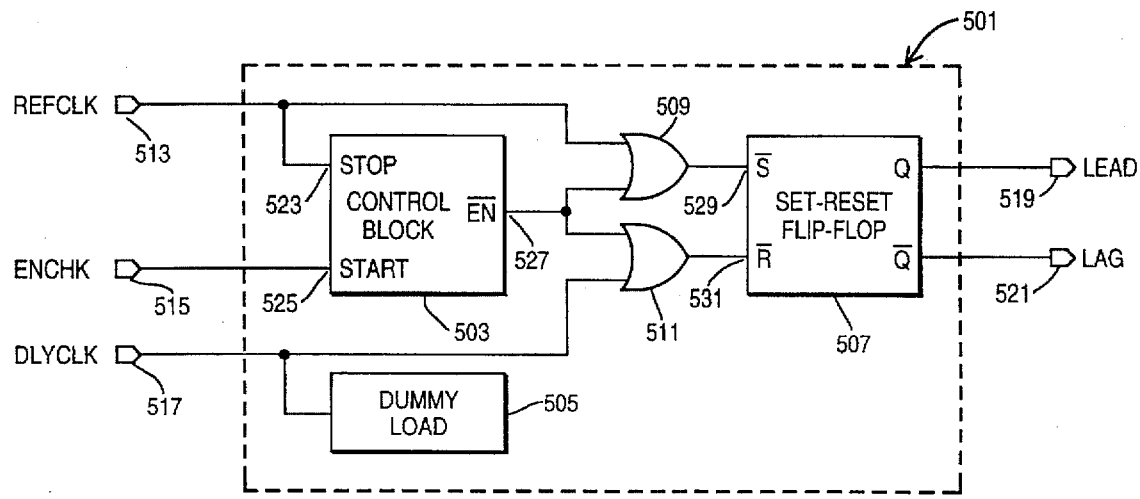
FIG_5

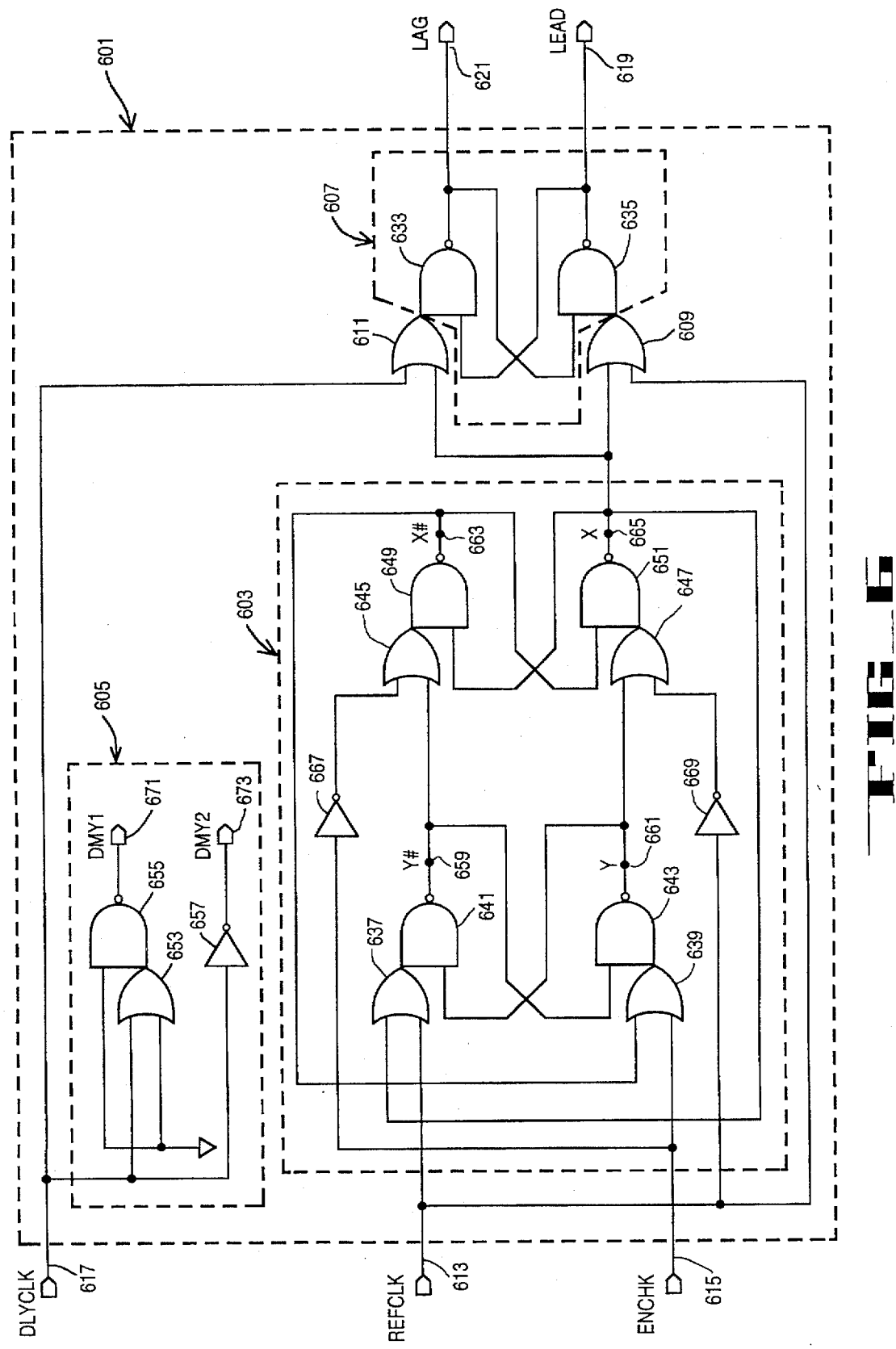
FIG_6

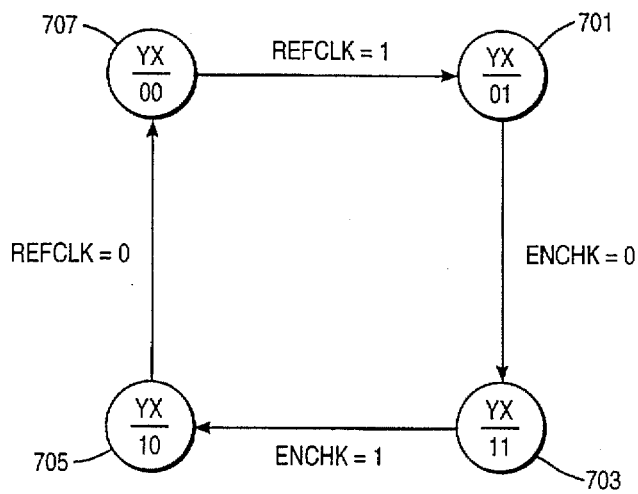
FIG_7
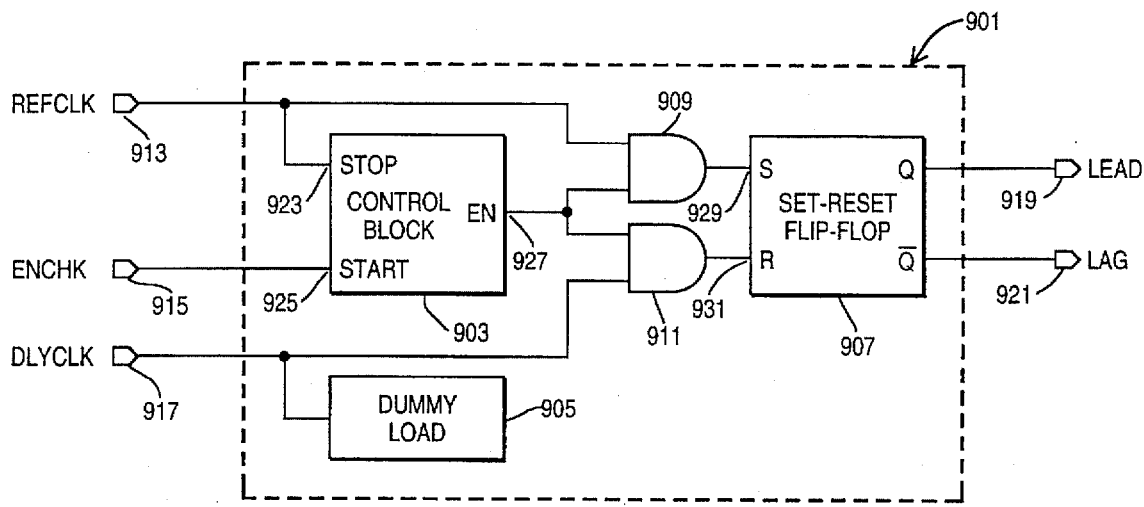
FIG_9
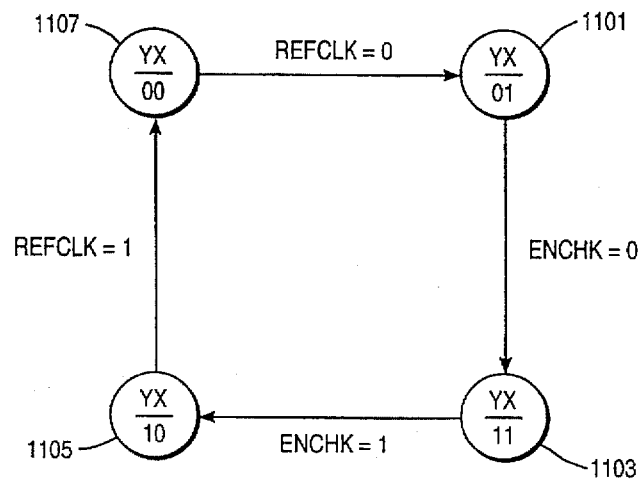
FIG_11

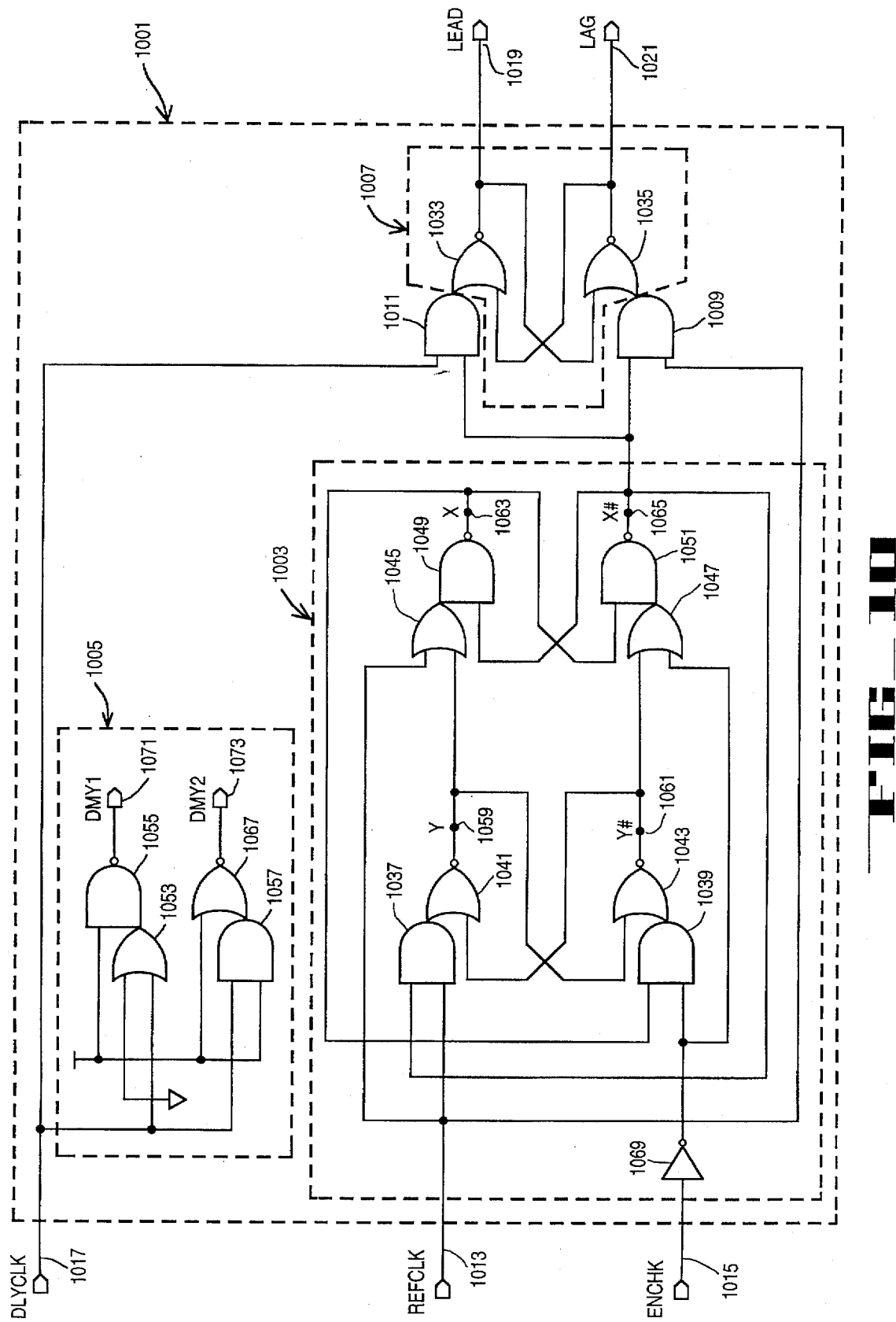
FIG_10

PHASE DETECTOR WITH EDGE-SENSITIVE ENABLE AND DISABLE

This is a continuation-in-part of Application Ser. No. 08/433,810 filed on May 3, 1995 now U.S. Pat. No. 5,583,458.

BACKGROUND OF THE INVENTION

1. Field of the Invention

This invention relates to digital waveform processing and, more particularly, to phase detection between two digital waveforms.

2. Description of the Related Art

In phase-locked systems, phase detectors are commonly used in feedback loops to determine the phase relationship between clocks such as a reference clock and a delayed clock. Using phase detectors to detect the phase differences between the reference clock and the delayed clock, negative feedback can be used to null differences in phase between the two clock signals.

If a digital phase detector senses that the delayed clock precedes the reference clock, the delayed clock has negative phase with respect to the reference clock and is therefore said to lead the reference clock. Conversely, if the digital phase detector senses that the delayed clock follows the reference clock, the delayed clock has positive phase with respect to the reference clock and is therefore said to lag the reference clock.

Accordingly, digital phase detectors generally receive two inputs, REFCLK and DLYCLK, which correspond with the reference clock and delayed clock signals. Furthermore, digital phase detectors often generate two outputs, LEAD and LAG, which correspond with negative and positive phase relationships between the two input signals, respectively. When there is a negative phase relationship between the two input signals, i.e. the delayed clock precedes the reference clock, the digital phase detector outputs an active LEAD signal or an inactive LAG signal. On the other hand, when there is a positive phase relationship between the two input signals, i.e. the reference clock precedes the delayed clock, the digital phase detector outputs an active LAG signal or an inactive LEAD signal.

An important characteristic of an ideal digital phase detector is identical processing for each of the two input signals. Identical processing, or perfect symmetry, is necessary in order to minimize the possibility of introducing any errors into phase measurements between the two inputs, REFCLK and DLYCLK. If a digital phase detector has asymmetric processing for the REFCLK and DLYCLK inputs, incorrect LEAD and LAG outputs may be generated by the phase detector. In contrast, an ideal digital phase detector with perfectly symmetric processing should introduce minimal error into phase measurements between the two inputs, even when the phase differences between the two signals are very small.

Many prior art digital phase detectors suffer from effects associated with their lack of symmetric circuitry. As a result, these prior art phase detectors inadvertently introduce errors into their phase measurements which may result in incorrect LEAD and LAG outputs.

Other prior art digital phase detectors may have symmetric circuitry, but these phase detectors have limited usefulness since their LEAD and LAG outputs are only valid for fractions of a clock period. In addition, many of these prior art detectors are limited to detecting phase differences between input waveforms which have the same frequency. Digital waveform synthesizers, such as the one described in U.S. Pat. No. 5,489,864 entitled "DELAY INTERPOLATION CIRCUITRY," require digital phase detectors capable of detecting phase differences between input waveforms having different frequencies.

Therefore, a digital phase detector having symmetric circuitry, having LEAD and LAG outputs that are valid for an entire clock period, and capable of detecting phase differences between input waveforms having different frequencies is desired.

SUMMARY OF THE INVENTION

A device for detecting a phase relationship between a reference clock signal and a delayed clock signal is described. In one embodiment, two half phase detector circuits are employed. Each of the half phase detector circuits are substantially similar to each other. Each half phase detector circuit includes a clock input, an enable check input, an enable input signal input, an auxiliary input signal input, an enable output signal output and an output signal output. An enable check signal is coupled to the enable check input of each half phase detector circuit. The reference clock signal is coupled to the clock input of one of the half phase detector circuits and the delayed clock signal is coupled to the clock input of the other half phase detector circuit. The auxiliary input signal of each respective half phase detector circuit is coupled to the output signal output of the other respective half phase detector circuit. The enable output signal output of one of the half phase detector circuits is coupled to the enable signal input of each half phase detector circuit. Additional features and benefits of the present invention will become apparent from the detailed description, figures and claims set forth below.

BRIEF DESCRIPTION OF THE DRAWINGS

The present invention is illustrated by way of example and not limitation in the accompanying figures.

FIG. 1 is a schematic of a prior art set-reset flip-flop used as a digital phase detector.

FIG. 2 is a timing diagram showing the relationship between two waveforms and the corresponding output waveforms of a prior art digital phase detector.

FIG. 3 is a timing diagram showing two waveforms that differ in frequency by a rational factor (2:3 in this diagram).

FIG. 4 is a block diagram of a prior art digital phase detector using a conventional edge-triggered latch circuit.

FIG. 5 is a block diagram of one embodiment of a digital phase detector with edge-sensitive enable and disable.

FIG. 6 is a schematic of one embodiment of a digital phase detector with edge-sensitive enable and disable.

FIG. 7 is a state-transition diagram for one embodiment of a digital phase detector.

FIG. 9 is a block diagram of another alternative embodiment of the present invention implemented as a falling edge phase detector.

FIG. 10 is a schematic of the alternative embodiment of the present invention implemented as a falling-edge phase detector.

FIG. 11 is a state-transition diagram of the present invention implemented as a falling edge phase detector.

DETAILED DESCRIPTION

Figure 8:
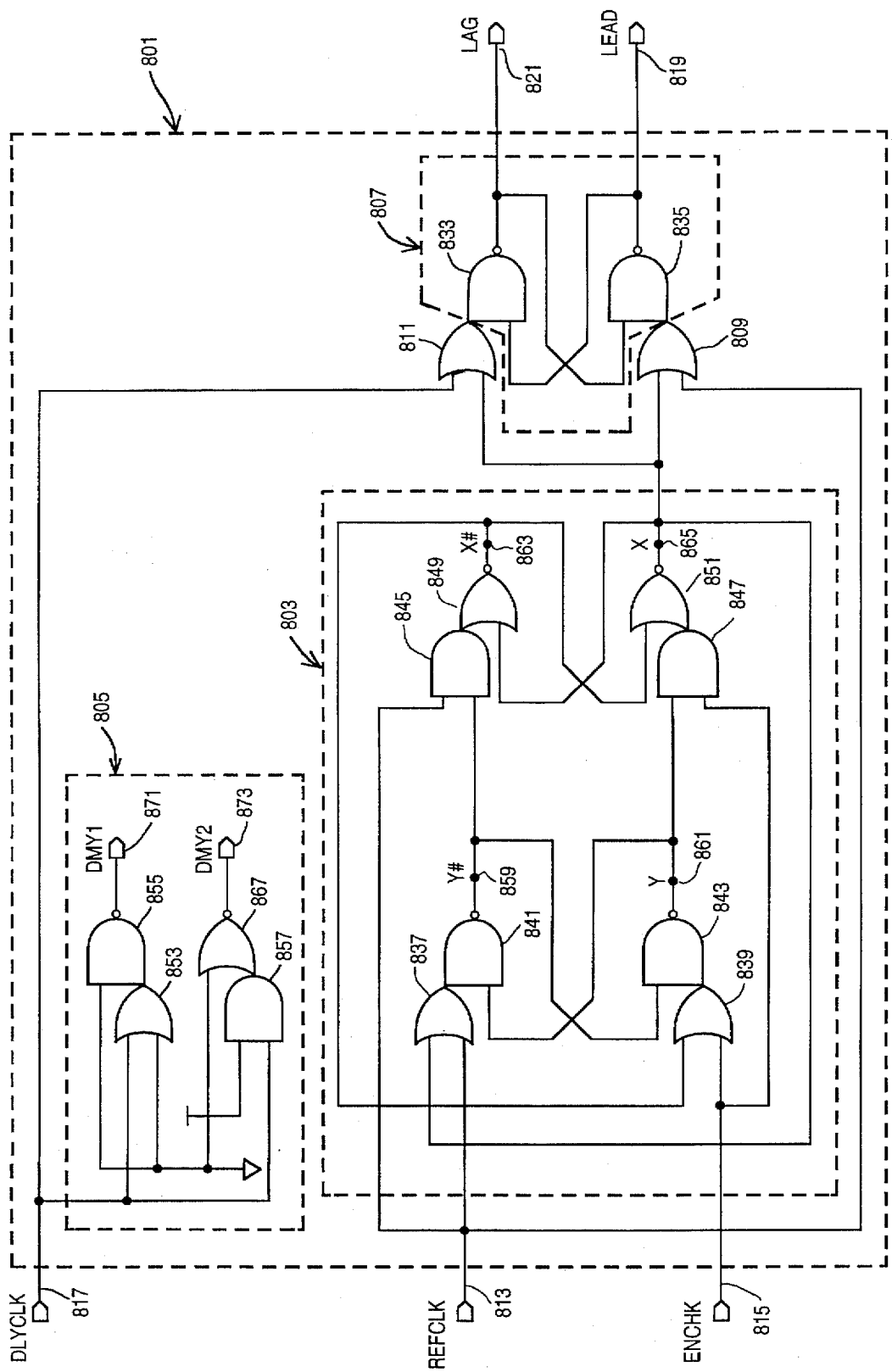
FIG. 8 is a schematic of an alternative embodiment of the present invention.

A digital phase detector having symmetric circuitry, having LEAD and LAG outputs that are valid for an unlimited amount of time, and capable of detecting phase differences between two input waveforms having different frequencies is described. In the following description, numerous specific details are set forth such as specific circuits in order to provide a thorough understanding of the present invention. The present invention, however, may be practiced without these specific details. In other instances, the details of well-known circuitry are not shown here in order not to obscure the present invention unnecessarily.

FIG. 1 is an illustration of a prior art digital phase detector 101 which is implemented using a simple set-reset flip-flip that satisfies the perfect symmetry requirements. Prior art phase detector 101 is comprised of a pair of cross-coupled logical-NAND gates 103 and 105. The set input 107 receives the reference clock signal, REFCLK, and the reset input 109 receives the delayed clock signal, DLYCLK. The lead signal, LEAD, is generated at output 111 and the lag signal, LAG, is generated at output 113.

Operation of prior art phase detector 101 can be observed in FIG. 2. When both REFCLK 201 and DLYCLK 203 are at a low level, both the LEAD 205 and LAG 207 outputs are at a high level. If REFCLK 201 goes high before DLYCLK 203, i.e., DLYCLK 203 lags REFCLK 201, LEAD 205 is changed to a low level as soon as REFCLK 201 goes high and LAG 207 remains at a high level. When DLYCLK 203 subsequently goes to a high level, as shown in FIG. 2, LEAD 205 and LAG 207 output levels remain unchanged. As soon as either of the REFCLK 107 and DLYCLK 109 inputs go low, however, LEAD 111 and LAG 113 outputs are invalid. As a consequence, prior art phase detector 101 is limited in its usefulness since LEAD 111 and LAG 113 are valid only for the fraction of a clock period before either REFCLK 107 and DLYCLK 109 go low.

An additional shortcoming with prior art phase detector 101 is that there is no control over which of the input edges are checked for phase detection. More specifically, if the waveforms input at REFCLK 107 and DLYCLK 109 differ in frequency by a rational factor, then the phase difference between the two input waveforms should only be measured at specific edges, or the aligned edges. The waveforms should not be measured at all edges indiscriminately for phase differences. FIG. 3 is an illustration of two waveforms REFCLK 301 and DLYCLK 303 which differ in frequency by a ratio of 2:3. Note that aligned edges 305 and 307 occur only periodically and that the other edges are not aligned. Therefore, for the purpose of phase detection, REFCLK 301 and DLYCLK 303 should only be examined at aligned edges 305 and 307 since it is known that the other edges will not be aligned.

FIG. 4 illustrates an alternative prior art phase detector 401 capable of detecting phase differences between two input waveforms having different frequencies, such as those illustrated in FIG. 3. Prior art phase detector 401 implements a conventional edge-triggered latch including a D-type flip-flop 403 and multiplexor 405. The D-type flip-flop 403 outputs LEAD 413 and LAG 415 signals. Enable check signal, ENCHK 407, is coupled to 2-1 multiplexor selector input 423. Reference clock signal, REFCLK 409, is coupled to the D-type flip-flop CLK input 425. Delayed clock signal, DLYCLK 411, is coupled to one of the 2-1 multiplexor inputs 421 and the LEAD 413 output is fed back to the other one of the 2-1 multiplexor's inputs 419. Multiplexor 405 output 427 is coupled to the D 417 input of flip-flop 403.

When ENCHK 407 is high, multiplexor 405 outputs DLYCLK 411 to the D 417 input of flip-flop 403. Accordingly, the rising edge of REFCLK 409 samples the DLYCLK 411 input. If, for example, DLYCLK 411 leads REFCLK 409, then DLYCLK 411 is high on a rising edge of REFCLK 411. Thus, an active signal, or high value, is output at LEAD 413 and an inactive signal, or low value, is output at LAG 415. When ENCHK 407 is low, multiplexor 405 feeds back the LEAD 413 signal to the D 417 input of flip-flop 403. Hence, when ENCHK 407 is low, flip-flop 403 does not sample DLYCLK 411. Instead, LEAD 413 is fed back into flip-flop 403 through multiplexor 405 and the LEAD 413 and LAG 415 outputs are stable and remain fixed in their previous states.

Thus, if ENCHK 407 is high only during aligned edges 305 of the two waveforms 301 and 303 of FIG. 3, prior art phase detector 401 is able to detect phase differences between the two input waveforms 301 and 303 differing in frequency by a rational factor. Furthermore, unlike prior art phase detector 101, the outputs of phase detector 401 are not invalid as soon as one of the two input waveforms go low.

Prior art phase detector 401, however, does not have the necessary characteristic of symmetry between inputs REFCLK 409 and DLYCLK 411. In order to be symmetric, phase detector 401 must process the REFCLK 409 and DLYCLK 411 inputs identically. Prior art phase detector 401 does not process REFCLK 409 and DLYCLK 411 symmetrically as DLYCLK 411 is coupled to multiplexor 405 and REFCLK 409 is coupled to CLK 425 of D-type flip-flop 403. Moreover, D 417 inputs are generally asymmetric with respect to the CLK 425 inputs of standard D-type flip-flops 403, thereby resulting in increased asymmetry between the REFCLK 409 and DLYCLK 411 inputs. Therefore, prior art phase detector 401 is also a less than desirable phase detector.

FIG. 5 is a block diagram of one embodiment of a phase detector 501 with an edge-sensitive enable and disable. A reference clock signal, REFCLK 513, a delayed clock signal, DLYCLK 517, and an enable check signal, ENCHK 515, are input to the phase detector 501 and corresponding LEAD 519 and LAG 521 signals are output by phase detector 501. Phase detector 501 includes a control block circuit 503 which provides an active low enable signal, $\overline{EN}$ 527, to a set-reset flip-flop 507 through logical-OR gates 509 and 511. The set-reset flip-flop 507 has active low inputs $\overline{S}$ 529 (set) and $\overline{R}$ 531 (reset), and is equivalent to prior art phase detector 101. $\overline{S}$ 529 receives input from logical-OR gate 509 and $\overline{R}$ 531 receives input from logical-OR gate 511. Logical-OR gate 509 is coupled to receive input from REFCLK 513 and $\overline{EN}$ 527, and logical-OR gate 511 is coupled to receive input from DLYCLK 517 and $\overline{EN}$ 527. Control block circuit 503 is coupled to receive REFCLK 513 as input at STOP 523, and ENCHK 515 as input at START 525. In order to equalize the parasitic loads on the input two signals REFCLK 513 and DLYCLK 517, dummy load 505 is attached to DLYCLK 517.

Operation of phase detector 501 is as follows. Control block 503 maintains $\overline{EN}$ 527 as inactive, or at a high logic level, until a low to high level transition is received on the ENCHK 515 line. With $\overline{EN}$ 527 at a high logic level, the $\overline{S}$ 529 and $\overline{R}$ 531 inputs receive high logic levels from logical-OR gates 509 and 511, irrespective of the input signals on REFCLK 513 and DLYCLK 517. Thus, with both $\overline{S}$ 529 and $\overline{R}$ 531 receiving high logic levels, the set-reset flip-flop 503 maintains its previous state indefinitely, and the LEAD 519 and LAG 521 output signals are therefore stabilized.

When a low to high logic level transition is detected at ENCHK 515, control block circuit 503 then outputs an active, or low logic level, at $\overline{EN}$ 527. Accordingly, logical-OR gates 509 and 511 receive "0's" from $\overline{EN}$ 527, and the set-reset flip-flop 507 inputs $\overline{S}$ 529 and $\overline{R}$ 531 are therefore able to sample the REFCLK 513 and DLYCLK 517 signals. Control block 503 is unable, however, to deactivate $\overline{EN}$ 527 back to a "1" until a low to high level transition is thereafter detected on REFCLK 513. Thus, control block circuit 503 then monitors REFCLK 513 for a low level logic signal. When the low level logic signal is detected on REFCLK 513, phase detection between REFCLK 513 and DLYCLK 517 continues, and the LEAD 519 and LAG 521 output signals are updated accordingly.

A subsequent low level to high level transition of REFCLK 513 captures the existing status of the LEAD 519 and LAG 521 output signals. If the waveform on DLYCLK 517 is at a high logic level, or has a low to high logic level transition before REFCLK 513 has the low to high logic level transition, then the LEAD 519 output is set to a high logic level and the LAG 521 output is set to a low logic level. In this instance, the waveform on DLYCLK 517 leads the waveform on REFCLK 513. On the other hand, if there is a low to high logic level transition on REFCLK 513 before there is a low logic level to high logic level transition on DLYCLK 517, then the LEAD 519 output is set to a low logic level and the LAG 521 output is set to a high logic level. In this instance, the waveform on DLYCLK 517 lags the waveform on REFCLK 513.

After control block circuit 503 detects the low to high logic level transition on REFCLK 513, control block circuit 503 deactivates $\overline{EN}$ 527 by raising it from a low to a high logic level. As a result, logical-OR gates 509 and 511 receive "1's" from $\overline{EN}$ 527, and set-reset flip-flop 507 therefore stops sampling the REFCLK 513 and DLYCLK 517 waveforms at the $\overline{S}$ 529 and $\overline{R}$ 531 inputs. Accordingly, LEAD 519 and LAG 521 outputs remain fixed at their respective values at the time of the low to high level transition of REFCLK 513 until the next low to high level transition of ENCHK 515.

Thus, phase detector 501 processes the REFCLK 513 and DLYCLK 517 signals with perfect symmetry. In addition, the phase relationship between REFCLK 513 and DLYCLK 517 is sensed only at selected intervals by set-reset flip-flop 507 in response to transitions on ENCHK 515 and REFCLK 513. Hence, the use of ENCHK 515 enables phase detector 501 to detect phase differences between input waveforms differing in frequency by a rational factor, such as edges 305 in waveforms 301 and 303 of FIG. 3. Another feature of the present invention is that the outputs LEAD 519 and LAG 521 of phase detector 501 are not invalid as soon as one of the two inputs REFCLK 513 or DLYCLK 517 go low. Instead, LEAD 519 and LAG 521 remain valid indefinitely until a subsequent low to high transition on ENCHK 515. Phase detector 501 is more flexible than prior art phase detector 401 since phase detector 501 only requires a low to high logic level transition of ENCHK 515 to enable sampling. Prior art phase detector 401 requires ENCHK 407 to remain at a high logic level for the entire duration in which sampling is to take place. In contrast, phase detector 501 only requires a low to high logic level transition of ENCHK 515 and is insensitive to the length of the ENCHK 515 pulse. Prior art phase detector 401, on the other hand, is very sensitive to the length of the ENCHK 407 pulse.

A schematic of one embodiment of phase detector 601 is shown in FIG. 6. This particular schematic is one of several possible implementations of the present invention. Control block circuit 603 includes two pairs of cross-coupled logical-NAND gates, 641 and 643, and 649 and 651. Logical-NAND gate 641 is also coupled to receive the output of logical-OR gate 637, and logical-NAND gate 643 is also coupled to receive the output of logical-OR gate 639. Logical-OR gate 637 is coupled to receive REFCLK 613 and the output of logical-NAND gate 651, and logical-OR gate 639 is coupled to receive ENCHK 615 and the output of logical-NAND gate 649. Logical-NAND gate 649 is also coupled to receive the output of logical-OR gate 645, and logical-NAND gate 651 is also coupled to receive the output of logical-OR gate 647. Logical-OR gate 645 is coupled to receive the outputs of logical-NAND gate 641 and logical-NOT gate 667. Logical-OR gate 647 is coupled to receive the outputs of logical-NAND gate 643 and logical-NOT gate 669. Logical-NOT gate 669 is coupled to receive REFCLK 613 and logical-NOT gate 667 is coupled to receive ENCHK 615.

As shown in FIG. 6, the output of logical-NAND gate 641 is denoted to be node Y# 659, the output of logical-NAND gate 643 is denoted to be Y 661, the output of logical-NAND gate 649 is denoted to be X# 663, and the output of logical-NAND gate 651 is denoted to be X 665. The output of logical-NAND gate 651 also corresponds with $\overline{EN}$ 527 of FIG. 5. Accordingly, the output of logical-NAND gate 651 is coupled to inputs of logical-OR gates 609 and 611. Logical-OR gate 609 is also coupled to receive REFCLK 613 and logical-OR gate 611 is further coupled to receive DLYCLK 617.

Set-reset flip-flop 607 includes cross-coupled logical-NAND gates 633 and 635. Logical-NAND gate 633 is also coupled to receive the output of logical-OR gate 611, and logical-NAND gate 635 is also coupled to receive the output of logical-OR gate 609. LAG 621 is output by logical-NAND gate 633, and LEAD 619 is output by logical-NAND gate 635.

Dummy load 605 is implemented using logical-OR, NAND, and NOT gates 653, 655, and 657, respectively. DLYCLK 617 is coupled to the inputs of logical-OR gate 653 and logical-NOT gate 657. The output of logical-OR gate 653 is coupled to an input of logical-NAND gate 655. An input of logical-NAND gate 655 and an input of logical-OR gate 653 are also coupled to $V_{SS}$. The outputs of logical-NAND gate 655 and logical-NOT gate 657, DMY1 671 and DMY2 673, respectively, are unused.

The logical-OR, NAND, and NOT gates 653, 655, and 657 used in dummy load 605 to load DLYCLK 617 are a replica of logical-OR, NAND, and NOT gates 637, 641, and 669, which are coupled to REFCLK 613. An analysis of control block circuit 603 reveals that the inputs to logical-OR gate 637 and logical-NAND gate 641 that are not connected to REFCLK 613 are at a low level before, and slightly after, REFCLK 613 makes a low level to high level transition. This particular low to high level transition of REFCLK 613 is "critical" since it is at this transition that causes the enable signal, $\overline{EN}$ 527, to be deactivated thereby locking in the result of the phase comparison into the phase detector outputs, LEAD 619 and LAG 621.

In order for logical-OR, NAND, and NOT gates 653, 655, and 657 to load DLYCLK 617 exactly the same as logical-OR, NAND, and NOT gates 637, 641, and 669 load REFCLK 613, the inputs to gates 653, 655, and 657 are coupled to the same logic levels as are the corresponding inputs of gates 637, 641, and 669 during the "critical" transition. As shown in FIG. 6, node Y 661 is coupled to an input of logical-NAND gate 641, and node X 665 is coupled to an input of logical-OR gate 637. During the "critical" transition, both nodes Y 661 and X 665 are at low levels, or Y 661="0" and X 665="0". Accordingly, the corresponding inputs to logical-OR gate 653 and logical-NAND gate 655 of dummy load 605 that are not connected to DLYCLK 617 are coupled to a low logic level, or $V_{SS}$. Thus, the parasitic load on DLYCLK 617 created by logical-OR, NAND, and NOT gates 653, 655, and 657 is identical to the parasitic load on REFCLK 613 created by logical-OR, NAND, and NOT gates 637, 641, and 669 during the "critical" transition.

Control block 603 of phase detector 601 is implemented as an asynchronous state machine whose operation can be understood with reference to the state-transition diagram of FIG. 7. The diagram includes four possible states of the control logic denoted by circles 701, 703, 705, and 707. The states represented by circles 701, 703, 705, and 707 contain the values for Y 661 and X 665. The logic levels at nodes Y 661 and X 665 of FIG. 6 at a particular time are considered as the corresponding state variables for the state-transition diagram of FIG. 7. The arrows between each of the circles indicate possible state transitions with corresponding input signal values for ENCHK 615 and REFCLK 613 which will cause the transition indicated by the associated arrow.

As shown in FIG. 7, control block 603 transitions from state 701 to state 703 when a low logic level is detected on ENCHK 615, or ENCHK 615=0. While in state 701, Y 661 is at a low logic level, or Y 661=0, and X 665 is at a high logic level, or X 665=1. After control block 603 transitions to state 703, Y 661=1 and X 665=1. Control block 603 transitions to state 705 when a high logic level is detected on ENCHK 615, or ENCHK 615=1. While in state 705, Y 661=1 and X 665=0. Control block 603 transitions to state 707 when a low level signal is detected on REFCLK 613, or REFCLK 613=0. While in state 707, Y 661=0 and X 665=0. Finally, control block 603 then transitions back to state 701 when a high logic level is detected on REFCLK 613, or REFCLK 613=1.

Thus, it is observed that X 665 transitions from high to low when there is a low to high transition of ENCHK 615. Further, X 665 transitions from low back to high when there is a low to high transition on REFCLK 613. Accordingly, X 665 of phase detector 601 is therefore equivalent to the $\overline{EN}$ 527 output of control block 503.

In light of the state-transition diagram of FIG. 7, the "critical" transition in which phase detection results are locked into the LEAD 619 and LAG 621 occurs at the state represented by circle 707, where Y 661="0" and X 665="0".

Further analysis of phase detector 601 shows that the capacitive loading on REFCLK 613 changes as a function of machine state. In particular, the capacitive loading presented by a complex logic gate on one of its inputs is a function of the logic levels at the other inputs. For example, logical-OR and NAND gates 637 and 641 of FIG. 6 load REFCLK 613 more when the signal present at node Y 661 is high than when it is low. Specifically, when the signal present at node Y 661 is high, and the signal at node X 665 is low, a low to high transition of REFCLK 613 results in a high to low transition at node Y# 659. This high to low transition at node Y# 659, through capacitive coupling between output node Y# 659 and input REFCLK 613 creates a Miller-effect increase in capacitive loading on REFCLK 613. If, on the other hand, the signal present at node Y 661 is low, a low to high transition of REFCLK 613 does not result in a transition at node Y# 659. Accordingly, under these conditions, there is no Miller-effect increase in the capacitive loading on REFCLK 613.

FIG. 8 shows a schematic of an alternate embodiment of the present invention as phase detector 801. Phase detector 801 is logically identical to phase detector 601, and is provided as another of the several possible alternate implementations of phase detector 601. Control block circuit 803 includes a pair of cross-coupled logical-NAND gates, 841 and 843, and a pair of cross-coupled logical-NOR gates 849 and 851. Logical-NAND gate 841 is also coupled to receive the output of logical-OR gate 837 and logical-NAND gate 843 is also coupled to receive the output of logical-OR gate 839. Logical-OR gate 837 is coupled to receive REFCLK 813 and the output of logical-NOR gate 851, and logical-OR gate 839 is coupled to receive ENCHK 815 and the output of logical-NOR gate 849. Logical-NOR gate 849 is also coupled to receive the output of logical-AND gate 845 and logical-NOR gate 851 is also coupled to receive the output of logical-AND gate 847. Logical-AND gate 845 is coupled to receive REFCLK 813 and the output of logical-NAND gate 841. Logical-AND gate 847 is coupled to receive ENCHK 815 and the output of logical-NAND gate 843.

Similar to phase detector 601 of FIG. 6, the output of logical-NAND gate 841 of FIG. 8 is denoted to be node Y# 859, the output of logical-NAND gate 843 is denoted to be Y 861, the output of logical-NOR gate 849 is denoted to be X# 863, and the output of logical-NOR gate 851 is denoted to be X 865. The output of logical-NOR gate 851 also corresponds with $\overline{EN}$ 527 of FIG. 5. Thus, the output of logical-NOR gate 851 is coupled to inputs of logical-OR gates 809 and 811. Logical-OR gate 809 is also coupled to receive REFCLK 813 and logical-OR gate 811 is further coupled to receive DLYCLK 817.

Like set-reset flip-flop 607 of FIG. 6, set-reset flip-flop 807 of FIG. 8 includes cross-coupled logical-NAND gates 833 and 835. Logical-NAND gate 833 is also coupled to receive the output of logical-OR gate 811 and logical-NAND gate 835 is also coupled to receive the output of logical-OR gate 809. LAG 821 is output by logical-NAND gate 833 and LEAD 819 is output by logical-NAND gate 835.

Dummy load 805 of phase detector 801 is implemented using logical-OR, NAND, AND, and NOR gates 853, 855, 857, and 867, respectively. DLYCLK 817 is coupled to the inputs of logical-OR gate 853 and logical-AND gate 857. The output of logical-OR gate 853 is coupled to an input of logical-NAND gate 855, and the output of logical-AND gate 857 is coupled to an input of logical-NOR gate 867. An input of logical-NAND gate 855, an input of logical-OR gate 853, and an input of logical-NOR gate 867 are coupled to $V_{SS}$, and an input of logical-AND gate 857 is coupled to $V_{CC}$. The outputs of logical-NAND gate 855 and logical-NOR gate 867, DMY1 871 and DMY2 873, respectively, are unused.

Similar to dummy load 605 of FIG. 6, the logical-OR, NAND, AND, and NOR gates 853, 855, 857, and 867 used in dummy load 805 of FIG. 8 to load DLYCLK 817 are a replica of logical-OR, NAND, AND, and NOR gates 837, 841, 845, and 849, which are coupled to REFCLK 813. When the "critical" low level to high level transition occurs on REFCLK 813, both nodes Y 861 and X 865 are at low levels, and node Y# 859 is at a high level, or Y 861="0", X 865="0", and Y# 859="1". Thus, in order to equalize the parasitic load on DLYCLK 817 created by gates 853, 855, 857, and 867, with the parasitic load on REFCLK 813 created by gates 837, 841, 845, and 849, during the low level to high level transition of REFCLK 813, the corresponding inputs of logical-OR, NAND, and NOR gates 853, 855, and 867 are coupled to $V_{SS}$, and the corresponding input of logical-AND gate 857 is coupled to $V_{CC}$.

Like control block circuit 603 of FIG. 6, control block circuit 803 of FIG. 8 is also implemented as an asynchronous state machine whose operation can be understood with reference to the state-transition diagram of FIG. 7. The logic levels at nodes Y 861 and X 865 at a particular time can also be considered as the corresponding state variables for the state-transition diagram of FIG. 7.

FIG. 9 shows a block diagram of phase detector 901 which is another alternate embodiment of the present invention. Phase detector 901 is similar to phase detector 501, but different in that phase detector 901 detects the phase difference between falling edges instead of rising edges of a reference clock signal and a delayed clock signal. The reference clock signal, REFCLK 913, the delayed clock signal, DLYCLK 917, and an enable check signal, ENCHK 915, are input to the phase detector 901 and corresponding LEAD 919 and LAG 921 signals are output. Phase detector 901 includes a control block circuit 903 which provides an active high enable signal, EN 927, to a set-reset flip-flop 907 through logical-AND gates 909 and 911. The set-reset flip-flop 907 has active high inputs S 929 (set) and R 931 (reset). S 929 receives input from logical-AND gate 909, and R 931 receives input from logical-AND gate 911. Logical-AND gate 909 is coupled to receive input from REFCLK 913 and EN 927, and logical-AND gate 911 is coupled to receive input from DLYCLK 917 and EN 927. Control block circuit 903 is coupled to receive REFCLK 913 as input at STOP 923, and ENCHK 915 as input at START 925. Dummy load 905 is coupled to DLYCLK 917 in order to equalize the parasitic loads on the two signals REFCLK 913 and DLYCLK 917.

Operation of phase detector 901 is as follows. Control block 903 maintains EN 927 as inactive, or at a low logic level, until a high logic level is received on the ENCHK 915 line. With EN 927 at a low logic level, the S 929 and R 931 inputs receive low logic levels from logical-AND gates 909 and 911, independent of the input signals on REFCLK 913 and DLYCLK 917. Thus, with both S 929 and R 931 receiving low logic levels, the set-reset flip-flop 903 maintains its previous state indefinitely.

When a low to high logic level transition is detected at ENCHK 915, control block circuit 903 then outputs an active, or high logic level, at EN 927. Accordingly, logical-AND gates 909 and 911 receive "1's" from EN 927, and the set-reset flip-flop 907 inputs S 929 and R 931 are therefore able to sample the REFCLK 913 and DLYCLK 917 signals. Control block 903 is unable, however, to deactivate EN 927 back to a "0" until a high to low level transition is detected on REFCLK 913. Thus, control block circuit 903 monitors REFCLK 913 for a high level logic signal. When the high level logic signal is detected on REFCLK 913, phase detection between REFCLK 913 and DLYCLK 917 continues, and the LEAD 919 and LAG 921 outputs are updated accordingly.

A subsequent high level to low level transition of REFCLK 913 captures the existing status of the LEAD 919 and LAG 921 output signals. If the waveform on DLYCLK 917 is at a low logic level, or has the high to low logic level transition before REFCLK 913 has a high to low logic level transition, then the LEAD 919 output is set to a high logic level and the LAG 921 output is set to a low logic level. In this instance, the waveform on DLYCLK 917 leads the waveform on REFCLK 913. If, on the other hand, there is a high to low logic level transition on REFCLK 913 before there is a high to low logic level transition on DLYCLK 917, then the LEAD 919 output is set to a low logic level and the LAG 921 output is set to a high logic level. In this instance, the waveform on DLYCLK 917 lags the waveform on REFCLK 913.

When control block circuit 903 detects the high logic level to low logic level transition on REFCLK 913, control block circuit 903 deactivates EN 927 by lowering the output from a high to a low logic level. As a result, logical-AND gates 909 and 911 receive "0's" from EN 927, and set-reset flip-flop 907 stops sampling the REFCLK 913 and DLYCLK 917 waveforms at the S 929 and R 931 inputs. Therefore, LEAD 919 and LAG 921 outputs remain fixed at their respective values from the time of the high to low level transition of REFCLK 913 until the next low to high level transition of ENCHK 915.

In sum, falling edge phase detector 901 differs from phase detector 501 in that logical-OR gates 509 and 511 of phase detector 501 are replaced in phase detector 901 with logical-AND gates 909 and 911, and the set-reset flip-flop inputs 529 and 531 are changed from active low to active high set-reset flip-flop inputs 929 and 931. Control block circuit 503 output $\overline{EN}$ 527 is changed from active low to active high output EN 927. In addition, EN 927 is deactivated by the high to low level transition of REFCLK 913, whereas $\overline{EN}$ 527 is deactivated by the low to high level transition of REFCLK 513.

A schematic of an implementation of falling edge phase detector 1001 is shown in FIG. 10. Control block circuit 1003 includes a pair of cross-coupled logical-NOR gates, 1041 and 1043, and a pair of cross-coupled logical-NAND gates 1049 and 1051. Logical-NOR gate 1041 is also coupled to receive the output of logical-AND gate 1037, and logical-NOR gate 1043 is also coupled to receive the output of logical-AND gate 1039. Logical-AND gate 1037 is coupled to receive REFCLK 1013 and the output of logical-NAND gate 1051, and logical-AND gate 1039 is coupled to receive the output of logical-NOT gate 1069 and the output of logical-NAND gate 1049. Logical-NOT gate 1069 is coupled to receive ENCHK 1015. Logical-NAND gate 1049 is also coupled to receive the output of logical-OR gate 1045, and logical-NAND gate 1051 is also coupled to receive the output of logical-OR gate 1047. Logical-OR gate 1045 is coupled to receive REFCLK 1013 and the output of logical-NOR gate 1041. Logical-OR gate 1047 is coupled to receive the outputs of logical-NOR gate 1043 and logical-NOT gate 1069.

As shown in FIG. 10, the output of logical-NOR gate 1041 is denoted to be node Y 1059, the output of logical-NOR gate 1043 is denoted to be Y# 1061, the output of logical-NAND gate 1049 is denoted to be X 1063, and the output of logical-NAND gate 1051 is denoted to be X# 1065. The output of logical-NAND gate 1051 also corresponds with EN 927 of FIG. 9. Thus, the output of logical-NAND gate 1051 is coupled to inputs of logical-AND gates 1009 and 1011. Logical-AND gate 1009 is also coupled to receive REFCLK 1013, and logical-AND gate 1011 is further coupled to receive DLYCLK 1017.

Set-reset flip-flop 1007 includes cross-coupled logical-NOR gates 1033 and 1035. Logical-NOR gate 1033 is also coupled to receive the output of logical-AND gate 1011, and logical-NOR gate 1035 is also coupled to receive the output of logical-AND gate 1009. LAG 1021 is output by logical-NOR gate 1035 and LEAD 1019 is output by logical-NOR gate 1033.

Dummy load 1005 is implemented using logical-OR, NAND, AND, and NOR gates 1053,1055,1057 and 1067, respectively. DLYCLK 1017 is coupled to the inputs of logical-OR gate 1053 and logical-AND gate 1057. The output of logical-OR gate 1053 is coupled to an input of logical-NAND gate 1055, and the output of logical-AND gate 1057 is coupled to an input of logical-NOR gate 1067. An input of logical-OR gate 1053 is coupled to $V_{SS}$, and inputs of logical-NAND gate 1055, logical-AND gate 1057, and logical-NOR gate 1067 are coupled to $V_{CC}$. The outputs of logical-NAND gate 1055 and logical-NOR gate 1067, DMY1 1071 and DMY2 1073, respectively, are unused.

The logical-OR, NAND, AND, and NOR gates 1053, 1055,1057, and 1067 used in dummy load 1005 to load DLYCLK 1017 are a replica of logical-OR, NAND, AND, and NOR gates 1045,1049,1037, and 1041, respectively, which are coupled to REFCLK 1013. When the "critical" high level to low level transition occurs on REFCLK 1013, both nodes Y# 1061 and X# 1065 are at high levels, and node Y 1059 is at a low level, or Y# 1061="1", X# 1065="1", and Y 1059="0". To equalize the load between the parasitic load on DLYCLK 1017 created by gates 1053,1055,1057, and 1067, with the parasitic load on REFCLK 1013 created by gates 1045,1049, 1037, and 1041, during a high to low level transition of REFCLK 1013, the corresponding inputs of logical-OR, NAND, AND, and NOR gates 1053, 1055,1057, and 1067 are biased to be the same as their counterpart gates 1045,1049,1037, and 1041 during the REFCLK 1013 high to low level transition.

Control block 1003 of falling edge phase detector 1001 is implemented as an asynchronous state machine whose operation can be understood with reference to the state-transition diagram of FIG. 11. The diagram includes four possible states of the control logic denoted by circles 1101, 1103,1105, and 1107. Circles 1101,1103,1105, and 1107 contain the values for Y 1059 and X 1063 for the particular state. The arrows between each of the circles indicate possible state transitions with corresponding input signal values for ENCHK 1015 and REFCLK 1013 which will cause the transition indicated by the associated arrow.

As shown in FIG. 11, control block 1003 transitions from state 1101 to state 1103 when a low logic level is detected on ENCHK 1015, or ENCHK 1015=0. While in state 1101, Y 1061 is at a low logic level, or Y 1059=0, and X 1063 is at a high logic level, or X 1063=1. After control block 1003 transitions to state 1103, Y 1059=1 and X 1063=1. Control block 1003 transitions to state 1105 when a high logic level is detected on ENCHK 1015, or ENCHK 1015=1. While in state 1105, Y 1059=1 and X 1063=0. Control block 1003 transitions to state 1107 when a high level signal is detected on REFCLK 1013, or REFCLK 1013=1. While in state 1107, Y 1059=0 and X 1063=0. Finally, control block 1003 then transitions back to state 1101 when a low logic level is detected on REFCLK 1013, or REFCLK 1013=0.

Accordingly, it is observed that X 1063 transitions from high to low when there is a low to high transition of ENCHK 1015. Further, X 1063 transitions from low back to high when there is a high to low transition on REFCLK 1013. Accordingly, the EN 927 output of control block 903 is equivalent to the inverse of X 1063, of falling edge phase detector 1001.

Figure 12:
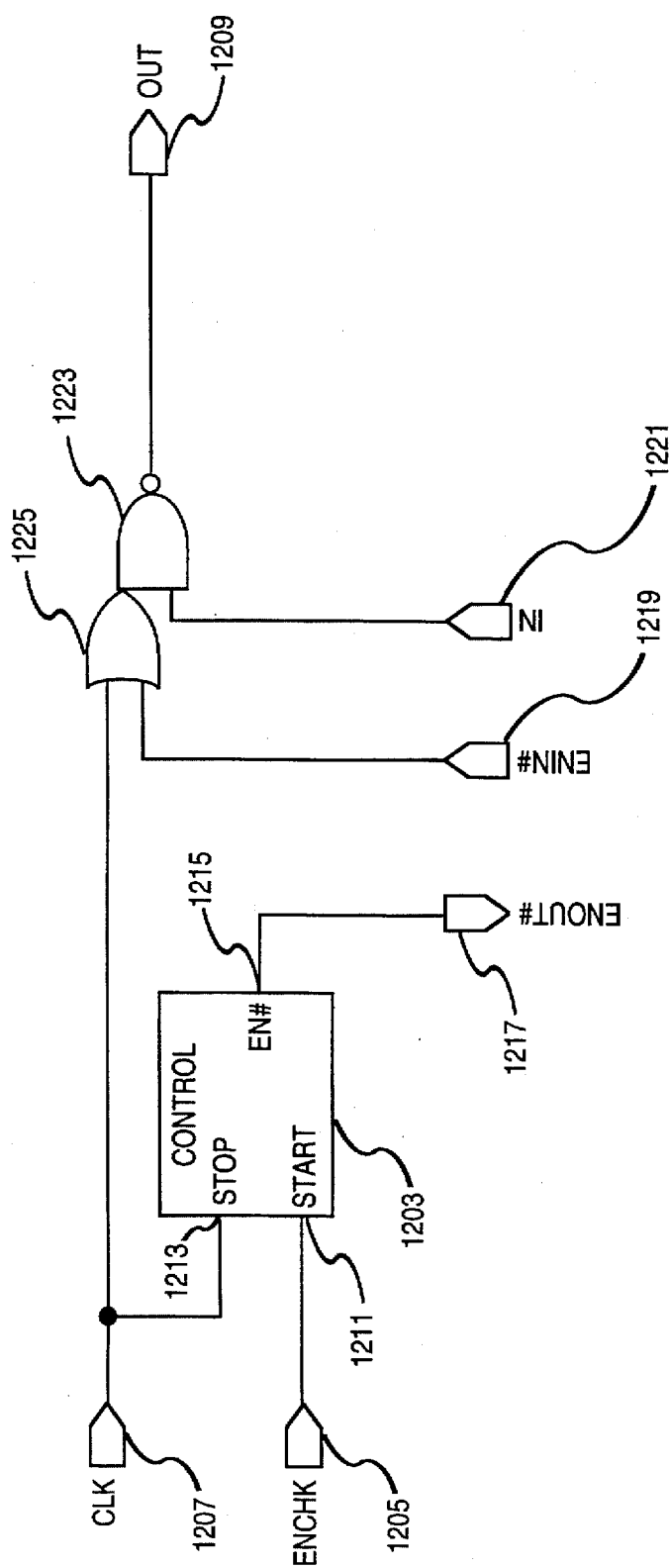
FIG. 12 is a block diagram of a half phase detector in accordance with the teachings of the present invention.

FIG. 12 is a block diagram of a half phase detector circuit 1201 which is used in another embodiment of the present invention. Half phase detector circuit 1201 includes control block circuit 1203 and a half phase detector subcircuit including logical-OR gate 1225 having an output coupled to an input of logical-NAND gate 1223. Control block circuit 1203 includes STOP input 1213 and START input 1211. Control block circuit 1203 generates enable output signal EN# 1215. Half phase detector circuit 1201 includes clock input CLK 1207 which is coupled to STOP input 1213 and another input of logical-OR gate 1225. Enable check signal ENCHK 1205 is coupled to START input 1211. An enable input signal ENIN# 1219 is coupled to another input of logical-OR gate 1225 and an auxiliary input signal IN 1221 as received by another input of logical-NAND gate 1223. An output signal OUT 1209 is generated at the output of logical-NAND gate 1223. An output signal of half phase detector 1201, ENOUT# 1217, is coupled to control block output signal EN# 1215.

As will be described in greater detail below, one embodiment of the present invention uses two identical half phase detector circuits 1201 to realize perfect load matching between the reference clock signal and the delayed clock signal. In one embodiment, the two half phase detectors 1201 are also identical in layout. By using two identical half phase detectors 1201, identical loading of the reference clock signal and delayed clock signal is ensured. It is noted that in the embodiments described above in FIGS. 6, 8 and 10, the dummy load must be laid out in such a way that the static capacitive load supplies a load as identical as possible to the delayed clock signal as the load supplied to the reference clock signal to achieve good load matching. It is also noted that the load supplied to the reference clock signal is a function of the machine state of the control block circuit. In comparison, the loading on the delayed clock signal is constant irrespective of the machine state since the dummy load provides a static capacitive load. Thus, there is a loading difference between the reference clock signal and the delayed clock signal that is dependent on the machine state in the embodiments described above.

As shown in FIG. 12, half phase detector circuit 1201 includes a full asynchronous finite state machine control block 1203 and half of the last stage flip-flop with the half phase detector subcircuit made up of logical-OR gate 1125 and logical-NAND gate 1123. Control block 1203 is the same as the control blocks described in the embodiments shown in FIGS. 5–11. By coupling the reference clock signal to CLK 1207 of one half phase detector circuit 1201 and coupling the delayed clock signal to the CLK 1207 input of another half phase detector circuit 1201, perfect load matching is realized since the two half phase detector circuits 1201 are identical to one another. As noted earlier, in one embodiment, two half phase detectors 1201 are identical in every way including layout.

Figure 13:
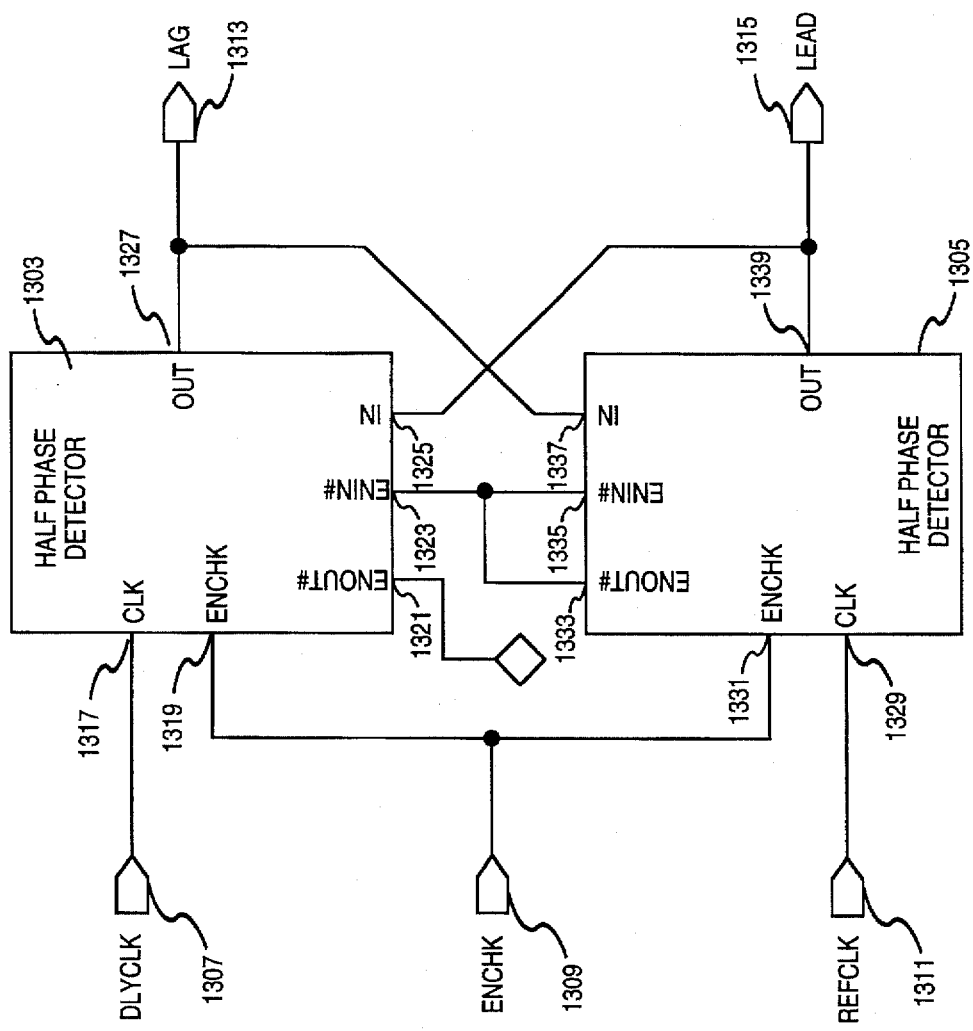
FIG. 13 is a block diagram of another embodiment of the present invention employing two half phase detectors in accordance with the teachings of the present invention.

FIG. 13 illustrates the connection of two half phase detector circuits 1303 and 1305 to arrive at a full phase detector circuit 1301. In one embodiment, each of the half phase detector circuits 1303 and 1305 are identical to one another including layout. In one embodiment of the present invention, half phase detector circuits 1303 and 1305 are realized as step=-and-repeat copies of a master copy. Therefore, the layouts of the two half phase detector circuits 1303 and 1305 are by definition completely identical. Phase detector circuit 1301 includes a delayed clock signal input DLYCLK 1307 coupled to the CLK input 1317 of half phase detector 1303. The reference clock signal REFCLK 1311 is coupled to the CLK 1329 input of half phase detector 1305.

An enable check signal ENCHK 1309 is coupled to the ENCHK inputs 1319 and 1331 of each half phase detector 1303 and 1305. The output signal OUT 1327 of half phase detector circuit 1303 generates LAG signal 1313 and the OUT signal 1339 of half phase detector circuit 1305 generates the LEAD signal 1315. As shown in FIG. 13, the auxiliary input signal of each half phase detector circuit, IN 1325 and IN 1337 is coupled to receive the output signal of the other respective half phase detector circuit. That is, OUT 1327 is coupled to IN 1337 and OUT 1339 is coupled to IN 1325. The enable output signal ENOUT# 1333 of half phase detector 1305 is coupled to the enable input signal inputs ENIN# 1323 and ENIN# 1335 of both half phase detector circuits 1303 and 1305. The enable output signal output ENOUT# 1321 of half phase detector circuit 1303 is left unconnected. This difference in the connections between the two half phase detector circuits 1303 and 1305 has no effect on the loading on the REFCLK 1311 and DLYCLK 1307 inputs.

The asynchronous finite state machine control blocks used in the two half phase detector circuits 1303 and 1305 are the same as the control block circuits described above and operate completely in tandem so that they are always in the same state. Therefore, the REFCLK 1311 and DLYCLK 1307 inputs are always loaded completely identically irrespective of the control states of the full asynchronous finite state machine control blocks.

Referring briefly back to the embodiment of the half phase detector subcircuit shown in FIG. 12, it is noted that logical-OR gate 1225 and logical-NAND 1223 correspond with the embodiments described with respect to FIGS. 5–8 discussed above. That is, the half phase detector subcircuit includes logical-OR gate 1225 and logical-NAND gate 1223 form half of a flip-flop circuit with logical-OR gates at the inputs as described in the embodiments shown in FIGS. 5–8. In another embodiment of the present invention, it is noted that the half phase detector subcircuit may be made up of a logical-AND gate with an output coupled to an input of a logical-NOR gate. Such an embodiment would correspond with the phase detector circuits described in FIGS. 9–11. In this instance, logic gate 1225 of FIG. 12 would be a logical-AND gate and logic gate 1223 would be a logic-NOR gate. Similarly, control block circuit 1203 would be similar to the control block circuit 1003 shown in FIG. 10 and described in FIGS. 9–11.

Figure 14:
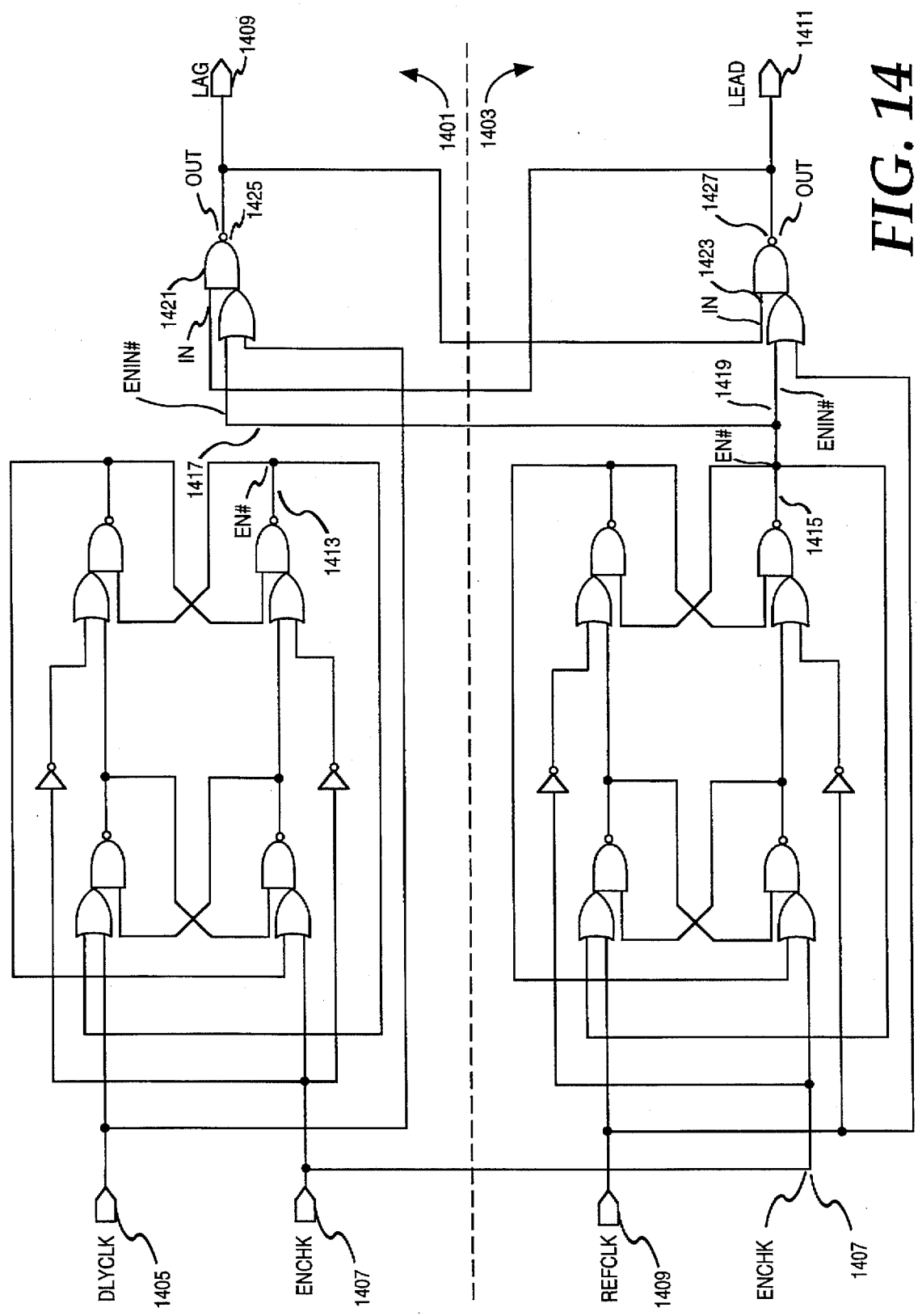
FIG. 14 is a schematic of a digital phase detector with edge-sensitive enable and disable utilizing two half phase detector circuits in accordance with the teachings of the present invention.

FIG. 14 is a detailed schematic of one embodiment of the present invention including two half phase detectors 1401 and 1403. The delayed clock signal DLYCLK 1405 is received by half phase detector circuit 1401 while reference clock signal REFCLK 1409 is received by the other half phase detector 1403. The enable check signal ENCHK 1407 is received by both half phase detector circuits 1401 and 1403. The output signal LAG 1409 is generated by half phase detector circuit 1401 while output signal LEAD 1411 is produced by half phase detector circuit 1403. The output signal OUT 1425 is coupled to the auxiliary input IN 1423 while the output signal 1427 is received by the auxiliary input IN 1421. The enable output signal EN# 1415 of half phase detector circuit 1403 is received by the enable input signal inputs ENIN# 1417 and ENIN# 1419 of each half phase detector circuit 1401 and 1403 respectively. Note that the enable output signal output EN# 1413 of half phase detector circuit is not connected to the enable input signal inputs ENIN# 1417 and ENIN# 1419 but is left unconnected.

Therefore, by implementing the phase detector from two completely identical half phase detectors 1401 and 1403, the capacitive loading on the REFCLK 1409 and DLYCLK 1405 signals are matched perfectly in a simple and straightforward manner.

Thus, a phase detector with edge-sensitive enable and disable is described. The phase detector and the alternative embodiments described herein provide symmetric edge-sensitive phase detection circuits for detecting a phase relationship between a reference clock signal and a delayed clock signal using an enable check signal. Although the present invention has been described in terms of specific embodiments, it will be appreciated that various modifications and alterations might be made by those skilled in the art without departing from the spirit and scope of the present invention.

I claim:

1. A device for detecting a phase relationship between a reference clock signal and a delayed clock signal, comprising:

two half phase detector circuits, each half phase detector circuit being substantially similar to one another, each half phase detector circuit having a clock input, an enable check input, an enable input signal input, an auxiliary input signal input, an enable output signal output and an output signal output; and an enable check signal coupled to the enable check input of each half phase detector circuit, the reference clock signal coupled to the clock input of one of the half phase detector circuits, the delayed clock signal coupled to the clock input of another one of the half phase detector circuits, the auxiliary input signal input of each respective half phase detector circuit coupled to the output signal output of another respective half phase detector circuit, the enable output signal output of said one of the half phase detector circuits coupled to the enable input signal input of each half phase detector circuit.

2. The device described in claim 1 wherein the enable output signal output of said one of the half phase detector circuits is activated from an inactive state only in response to a first to second logic level transition of the enable check signal and deactivated from an active state only in response to a first to second logic level transition of the reference clock signal.

3. The device described in claim 2 wherein each one of the half phase detector circuits comprises:

a control block circuit having a stop input, a start input and the enable output signal output, the stop input coupled to the clock input, the start input coupled to the enable check input; and a half phase detector subcircuit coupled to the clock input, the half phase detector subcircuit having the enable input signal input, the auxiliary input signal input and the output signal output.

4. The device described in claim 3 wherein the half phase detector subcircuit comprises a logical-OR gate having an output coupled to an input of a logical-NAND gate, the logical-OR gate coupled to receive the clock input and the enable input signal input, the logical-NAND gate further coupled to receive the auxiliary input signal input and generating the output signal output.

5. The device described in claim 3 wherein the half phase detector subcircuit comprises a logical-AND gate having an output coupled to an input of a logical-NOR gate, the logical-AND gate coupled to receive the clock input and the enable input signal input, the logical-NOR gate further coupled to receive the auxiliary input signal input and generating the output signal output.

6. A device for detecting a phase relationship between a reference clock signal and a delayed clock signal, comprising:

- a first control block circuit coupled to the reference clock signal and generating a first enable signal;
- a second control block coupled to the delayed clock signal and generating a second enable signal, the second control block being substantially similar to the first control block circuit;
- a phase detection circuit coupled to the reference clock signal, the delayed clock signal and the first enable signal, the phase detection circuit having symmetric processing for the reference clock signal and the delayed clock signal; and
- an enable check signal coupled to the first and second control block circuits, the device detecting the phase relationship between the reference clock signal and delayed clock signal only in response to the first enable signal.

7. The device described in claim 6 wherein the first enable signal is activated from an inactive state only in response to a first to second logic level transition of the enable check signal and deactivated from an active state only in response to a first to second logic level transition of the reference clock signal.

8. The device described in claim 6 wherein the phase detection circuit includes a lead output and a lag output, the lead output and lag output indicating the phase relationship between the reference clock signal and the delayed clock signal.

9. The device described in claim 8 wherein the phase detection circuit generates an inactive lead output and an active lag output if the delayed clock signal is at a low level when the reference clock signal has a low level to high level transition.

10. The device described in claim 8 wherein the phase detection circuit generates an active lead output and an inactive lag output if the delayed clock signal is at a high level when the reference clock signal has the low level to high level transition.

11. The device described in claim 8 wherein the phase detection circuit generates an inactive lead output and an active lag output if the delayed clock signal is at a high level when the reference clock signal has a high level to low level transition.

12. The device described in claim 8 wherein the phase detection circuit generates an active lead output and an inactive lag output if the delayed clock signal is at a low level when the reference clock signal has the high level to low level transition.

* * * * *